(12) United States Patent
Hsiao et al.

(10) Patent No.: US 6,417,022 B1
(45) Date of Patent: Jul. 9, 2002

(54) METHOD FOR MAKING LONG FOCAL LENGTH MICRO-LENS FOR COLOR FILTERS

(75) Inventors: Yu-Kung Hsiao, Tao-Yuan; Sheng-Liang Pan, Hsin Chu; Bi-Cheng Chang, Hsin Chu; Kuo-Liang Lu, Hsin-Chu, all of (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/547,546

(22) Filed: Apr. 12, 2000

(51) Int. Cl.⁷ .............................................. H01L 21/00
(52) U.S. Cl. ........................................... 438/70; 438/72
(58) Field of Search ............................. 438/69, 70, 71, 438/72, 780

(56) References Cited

U.S. PATENT DOCUMENTS 5,422,285 A * 6/1995 Ishibe ......................... 438/69
5,514,888 A * 5/1996 Sano et al. .................... 438/69

\* cited by examiner

*Primary Examiner*—Chandra Chaudhari
(74) *Attorney, Agent, or Firm*—Tung & Associates

(57) ABSTRACT

A method for making long focal length micro-lens for color filters in CMOS image sensor applications and device made by the method are described. In the method, a layer of micro-lens material is first spin coated on top of a color filter, patterned by a photolithographic method into at least four discrete regions, and preferably at least nine discrete regions for each micro-lens with a pre-set spacing therein between. The discrete regions allow a smaller volume of micro-lens material to be used for forming the micro-lens in a subsequent reflow process. The micro-lens formed by the present invention novel method has a focal length of at least 7 μm, and preferably at least 10 μm such that a 0.35 μm technology CMOS image sensor utilizing two or three layers of metal conductors can be formed by the present invention method.

12 Claims, 3 Drawing Sheets

METHOD FOR MAKING LONG FOCAL LENGTH MICRO-LENS FOR COLOR FILTERS

FIELD OF THE INVENTION

The present invention generally relates to a method for fabricating micro-lens for color filters and devices fabricated and more particularly, relates to a method for fabricating long focal length micro-lens for color filters and devices fabricated by such method.

BACKGROUND OF THE INVENTION

Color fillers have been used in image sensors for CCD or CMOS applications for producing color images. An essential part of the color filters is the multiplicity of micro-lenses that is formed on top of the color filters in order to focus a light beam. Micro-lenses can be fabricated by a variety of different methods. one of the more frequently used methods is by a standard photolithographic technique followed by reflowing photoresist strips that are formed in cylinders or squares into hemispheres. The technique is carried out by exposing the photoresist to process temperatures in excess of the glass transition temperature of the micro-lens material. At a temperature higher than the glass transition temperature, the cohesive force in the material that forms the solid patterns causes the surface area to be minimized forming a hemisphere.

A typical process for forming a multiplicity of micro-lenses for color filters is shown in FIGS. 1A and 1B. Referring now to FIG. 1A, wherein a process flow chart 10 for fabricating a micro-lens is shown. The process flow-chart 10 corresponds to the structure 20 shown in FIG. 1B for a CMOS image sensor including a multiplicity of micro-lenses 12 and a multiplicity of color filters 22. As shown in FIG. 1B, a photodiode 24 is first formed in the surface of a substrate 26, which also includes a series of metal conductors 28 covered by a layer of passivation 30 that forms an irregular upper surface 32. The irregular upper surface 32 is then planarized by depositing a layer of dielectric material 34 over the passivation layer 30. As shown in FIG. 1A, after the planarization step 14 has been performed, a subsequent step 16 is carried out to form a color filter layer 16 providing red, green and blue color elements. As a final step, a micro-lens spacer 36 is applied by step 18 following which a micro-lens 12 is formed by step 38.

A more detailed view of the conventional color filter 20 is shown in FIGS. 2A, 2B, 3A and 3B. FIG. 2A illustrates an enlarged, cross-sectional view of the image sensor 20 before the micro-lens reflow process, while FIG. 2B illustrates an enlarged, cross-sectional view of the image sensor 20 after the micro-lens reflow process. By using the conventional technology, the micro-lens material layer (not shown) is first spin coated on the surface of the spacer layer 36. The thinnest possible thickness for the micro-lens material layer formed by using the presently available spin coating technology is between about 1.3 $\mu$m and about 1.4 $\mu$m. This is achieved at a spinning speed of about 4500 RPM. By using the conventional technology, the focal length of the micro-lens fabricated is about 5~6 $\mu$m for a 6 $\mu$m diameter micro-lens. The focal length achieved is not sufficient for the new generation color filters, i.e. for 0.35 $\mu$m technology CMOS image sensors which require a focal length of at least 7 $\mu$m and preferably 10 $\mu$m. The longer focal length is necessary in order for a light beam to focus on the photodiode 24 that is formed in the substrate 26. A multiple number of micro-lenses is shown in a plane view of FIG. 3B while an enlarged, cross-sectional view of a single micro-lens formed by the conventional method with a large diameter is shown in FIG. 3B.

The conventional CMOS image sensor shown in FIG. 2B has only one metal layer 28 formed in a passivation layer 30 and a planarization layer 34. In modern semiconductor devices used as image sensors, a multiple number of metal layers, for instance 3 metal conductor layers are utilized in a 0.35 $\mu$m technology CMOS image sensor. The small diameter of the micro-lens 12, which is contributed by the large thickness of the micro-lens material spin-coated (FIG. 2A) cannot produce a micro-lens that has the necessary focal length of at least 7 $\mu$m and preferably at least 10 $\mu$m. In order to reduce the thickness of the micro-lens material, as shown in FIG. 2A, a significantly higher rotational speed must be utilized in a spin coating process, i.e. a speed higher than 4500 RPM for producing a thickness of 1.4 $\mu$m micro-lens material. At such high rotational speed, various other processing problems can be caused which include a possible loss of wafer from the wafer platform due to a break in vacuum used in holding the wafer. It is therefore impossible to vary the processing parameters of a spin coating process in order to provide a thinner layer of the micro-lens material, or to produce a multiplicity of micro-lenses each having a focal length longer than 7 $\mu$m.

It is therefore an object of the present invention to produce a long focal length micro-lens in an image sensor application that does not have the drawbacks or shortcomings of conventional methods.

It is another object of the present invention to provide a method for making a long focal length micro-lens for use in color filters that have a focal length of at least 7 $\mu$m.

It is a further object of the present invention to provide a method for making a long focal length micro-lens for colored filters that is suitable for fabricating 0.35 $\mu$m technology CMOS image sensors.

It is another further object of the present invention to provide a method for making a long focal length micro-lens for colored filters that can be used for CMOS image sensors that have at least two metal conductor layers.

It is still another object of the present invention to provide a method for making a long focal length micro-lens for color filters that is suitable for producing a micro-lens material layer of less than 1 $\mu$m thick.

It is yet another object of the present invention to provide a method for making a long focal length micro-lens for color filters suitable for use in CMOS image sensors wherein a micro-lens material is first coated to a thickness of less than 1 $\mu$m, and then patterned and reflowed into micro-lenses having a focal length larger than 7 $\mu$m for 6 $\mu$m diameter micro-lenses.

It is still another further object of the present invention to provide a color filter that has a multiplicity of long focal length micro-lenses built thereon wherein each of the multiplicity of micro-lenses has a focal length of at least 10 $\mu$m for 6 $\mu$m diameter micro-lenses.

It is yet another further object of the present invention to provide a color filter that has a multiplicity of long focal length micro lenses built thereon for a CMOS image sensor application that contains at least two metal conductor layers with metal conductors embedded in at least two insulating material layers.

SUMMARY OF THE INVENTION

In accordance with the present invention, a method for making long focal length micro lenses for color filters and a device made by such method are provided.

In a preferred embodiment, a method for making long focal length micro-lenses for color filters can be carried out by the operating steps of first providing a semiconductor substrate that has at least one photodiode formed in a top surface; forming at least two metal conductor layers with metal conductors embedded in at least two insulating layers; forming a photoresist layer on top of the at least two metal conductor layers, the photoresist layer further includes a color agent therein for forming color filters of at least one of red, green and blue colors; depositing a layer of micro-lens material on top of the photoresist layer; patterning the layer of micro-lens material into at least four discrete regions for each micro-lens with pre-set spacing therein between; and reflowing the at least four discrete regions for the micro-lens and forming the micro-lens.

The method for making a long focal length micro-lens for color filters may further include the step of forming the at least two metal conductor layers to a thickness of at least 7 $\mu$m, and preferably to a thickness of at least 10 $\mu$m. The method may further include the step of forming the photoresist layer containing a color agent of a pigment or dye therein for forming color filters of red, green or blue. The method may further include the step of depositing a layer of micro-lens material of polymeric nature on top of the photoresist layer, or the step of depositing a layer of micro-lens material selected from the group consisting of acrylic and epoxy novolac resin, or the step of depositing a layer of micro-lens material that is transparent on top of the photoresist layer.

The method for making long focal length micro-lens for color filters may further include the step of patterning the layer of micro-lens material into at least four discrete regions in square shape for each micro-lens. The method may further include the step of patterning the layer of micro-lens material into at least four discrete regions in elongated strips for each micro-lens, or the step of patterning the layer of micro-lens material into at least nine discrete regions in square shape for each micro-lens, or the step of forming the pre-set spacing between the at least four discrete regions to larger than 0.01 $\mu$m. The method may further include the step of providing the semiconductor substrate that has at least one photodiode formed in a top surface to a depth of at least 0.1 $\mu$m.

The present invention is further directed to a color filter that has a multiplicity of long focal length micro-lenses build thereon including a semiconductor substrate that has at least one photodiode formed in a top surface; at least two metal conductor layers with metal conductors embedded in at least two insulating layers; a photoresist layer on top of the at least two metal conductor layers, the photoresist layer further includes a color agent therein for forming color filters of at least one of red, green or blue color; a multiplicity of micro-lenses on top of the photoresist layer each positioned corresponding to one of the color filters of at least one of red, green or blue color, the multiplicity of micro-lenses each has a focal length of not less than 7 $\mu$m.

In the color filter that has a multiplicity of long focal length micro-lenses built thereon, the multiplicity of micro-lenses each having a focal length of preferably not less than 10 $\mu$m. The at least two metal conductor layers may include three metal conductor layers with metal conductors embedded in three insulating material layers, the at least one photodiode formed in the top surface of the semiconductor substrate may have a thickness of at least 0.1 $\mu$m. The at least two insulating material layers are formed of dielectric materials. The color agent may be a dye or a pigment. The color filters may be formed of red, green or blue color. The layer of micro-lens material is formed of a polymeric material, a transparent material, or an acrylic or epoxy novolac resin.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for making long focal length micro-lenses for color filters for use in CMOS image sensors and devices made by such method.

In the method for fabricating long focal length micro-lens for color filters, after a layer of micro-lens material is first spin coated on top of a photoresist layer, the layer of micro-lens material is patterned by a photolithographic method into at least four discrete regions, and preferably into at least nine discrete regions for each micro-lens with a pre-set spacing therein between. The pre-set spacing may be at least 0.01 $\mu$m for a 6 $\mu$m diameter micro-lens. The discrete regions formed in the micro-lens material layer may be an array of squares or a grating pattern of strips. The discrete regions with spacing therein between effectively reduce the amount of the micro-lens material available for forming the micro-lenses during the reflow process. The larger the spacing formed in-between the discrete regions, the lesser the total material is available for forming the micro-lenses, and therefore the larger the focal length of the micro-lenses formed. The present invention novel method effectively reduce the volume of micro-lens material available for forming the micro-lens and therefore resulting in long focal length micro-lens. For a 6 $\mu$m diameter micro-lens, the focal length of the micro-lens obtained by the present invention novel method can be at least larger than 7 $\mu$m, or preferably at least larger than 10 $\mu$m.

The present invention novel method eliminates the problem that would otherwise be caused when attempting to form a thinner micro-lens material layer on top of color filters by increasing the spinning speed during a spin coating process. For instance, in order to form a micro-lens material layer having a thickness less than 1 μm, very high spinning speed such as 7,000~8,000 RPM must be used. At such high RPM, a vacuum break may occur such that the wafer is no longer held by vacuum on the wafer platform. This results in severe wafer damage or a complete breakage of the wafer.

The present invention is further directed to a color filter that has a multiplicity of long focal length micro-lenses built thereon. The multiplicity of micro-lenses formed on top of a photoresist layer is each positioned corresponding to one of the color filters of red, green or blue. The multiplicity of micro-lenses each has a focus length of not less than 7 μm, and preferably not less than 10 μm. Such focus length of the micro-lenses is suitable for use in 0.35 μm technology CMOS image sensors wherein at least two or three metal conductor layers are utilized which are embedded in at least two or three insulating material layers having a total thickness of about 7 μm.

Figure 1A:
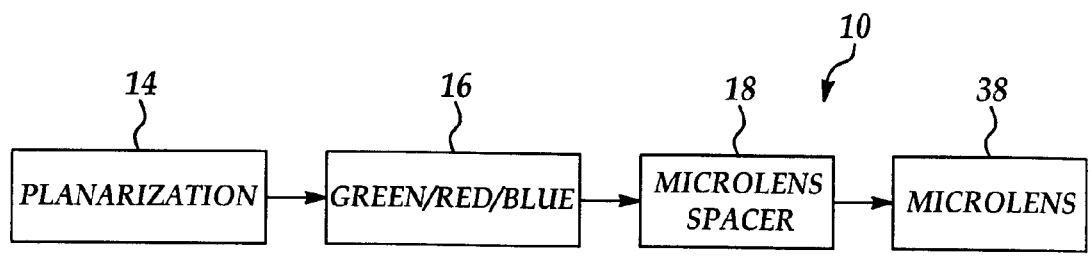
FIG. 1A is a process flow chart for a conventional process for forming a micro-lens on a color filter.
Figure 1B:
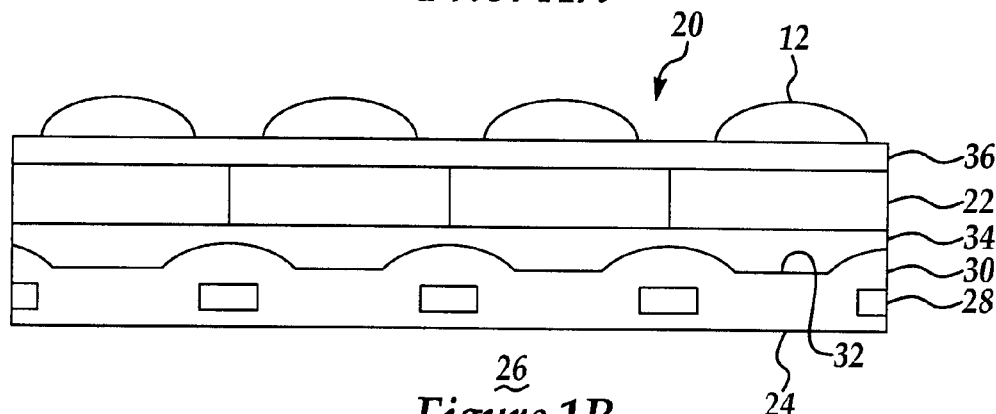
FIG. 1B is an enlarged, cross-sectional view of a conventional CMOS image sensor with color filters and a multiplicity of micro-lenses formed thereon.
Figure 2A:
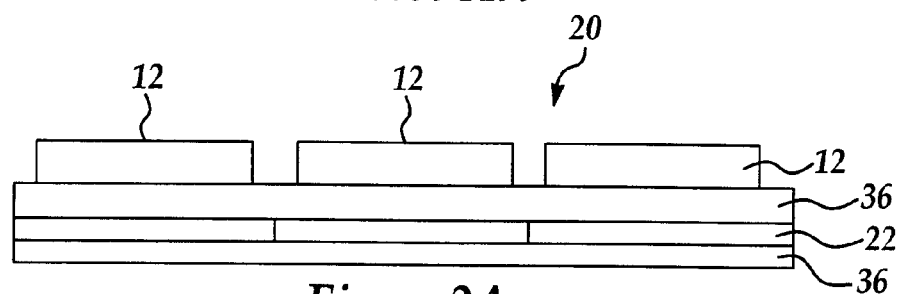
FIG. 2A is an enlarged, cross-sectional view of a conventional color filter with a micro-lens material deposited and patterned thereon prior to the reflow process.
Figure 2B:
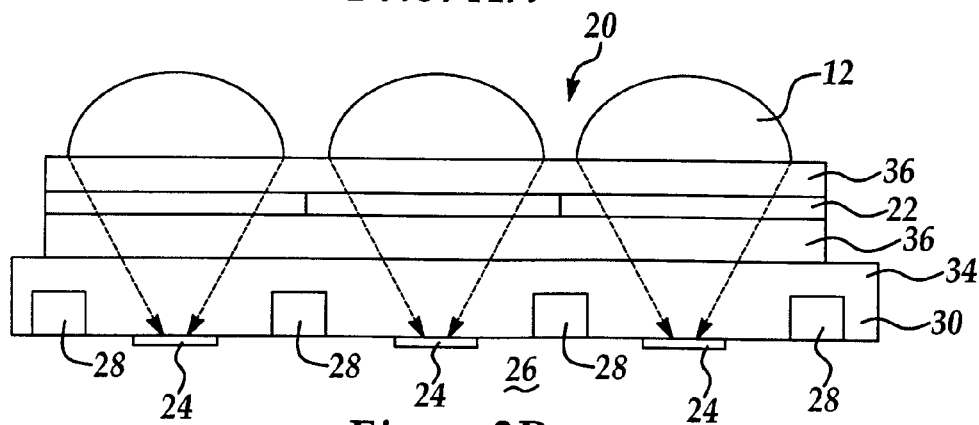
FIG. 2B is an enlarged, cross-sectional view of a conventional CMOS image sensor with a multiplicity of micro-lenses built thereon.
Figure 3A:
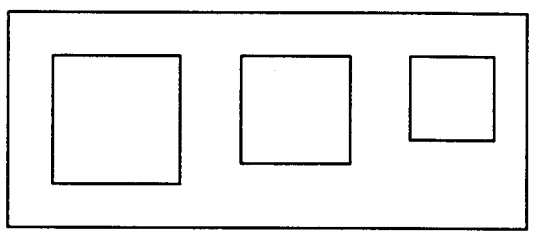
FIG. 3A is an enlarged, plane view of a layer of conventional micro-lens material patterned into squares.
Figure 3B:
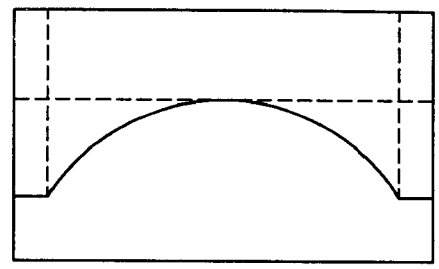
FIG. 3B is an enlarged, cross-sectional view of a conventional micro-lense formed after a reflow process.
Figure 4A:
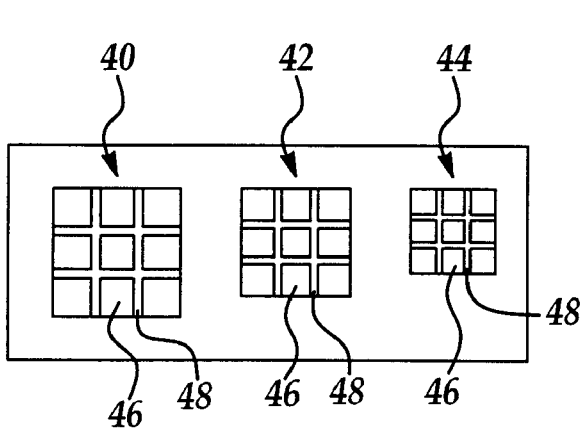
FIG. 4A is an enlarged, plane view of the present invention micro-lens material layer patterned on top of a color filter.
Figure 4B:
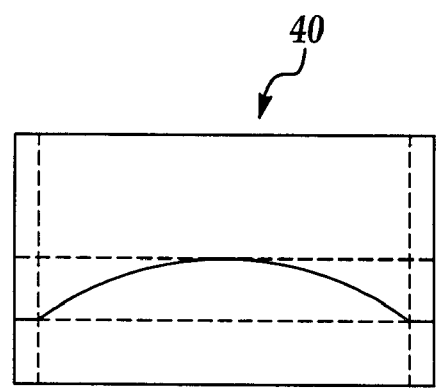
FIG. 4B is an enlarged, cross-sectional view of a present invention micro-lens after a reflow process.
Figure 4C:
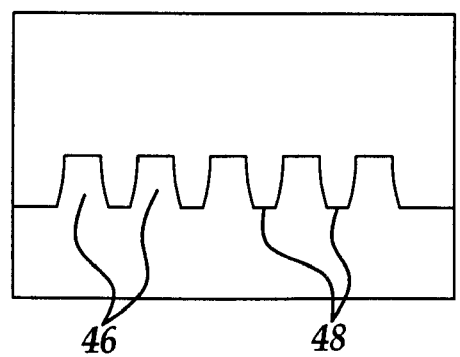
FIG. 4C is an enlarged, cross-sectional view of the present invention micro-lens material layer after patterning by a photolithographic process.

Referring now to FIG. 4A wherein an enlarged, plane view of a present invention micro-lens material layer after patterning by a photolithographic method is shown. The patterned micro-lens material is shown in three separate embryos 40, 42 and 44 for forming three separate micro-lenses of long focal length. It is noted that each of the micro-lens embryo is divided into nine discrete regions 46 of different sizes. The spacing 48 between the regions 46 is pre-set at at least 0.01 μm when a 6 μm diameter micro-lens is to be formed. For micro-lenses of larger focal length, larger pre-set spacings 48 between regions 46 should be used. After the embryos 40, 42 and 44 are patterned by a standard photolithographic method, the embryos are reflown in a reflow process at a temperature of about 160° C. forming a micro-lens such as that shown in FIG. 4B in an enlarged, cross-sectional view. An enlarged cross-sectional view of the region 46 in a micro-lens embryo that was divided into 25 regions is further shown in FIG. 4C. It should be noted that the discrete regions are reflown and joined together after a reflow process conducted at about 160° C. for a pre-determined length of time.

Figure 5A:
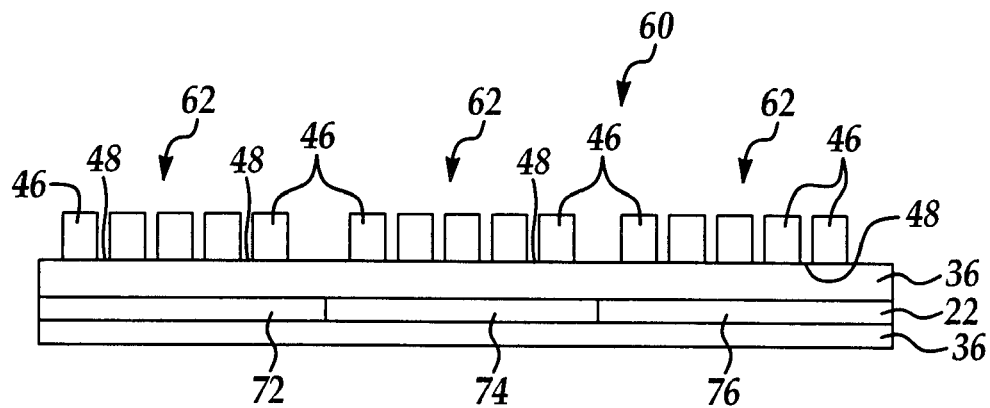
FIG. 5A is an enlarged, cross-sectional view of a present invention color filter with a multiplicity of micro-lenses patterned on top prior to a reflow process.

Another enlarged, cross-sectional view of a present invention color-filter 60 that has a multiplicity of micro-lenses 62 built thereof is shown in FIG. 5A. It should be noted that the color filter layer 22 may consist of a red filter 72, a green filter 74 and a blue filter 76. While the color filter layer 22 is embedded in a spacer layer 36.

Figure 5B:
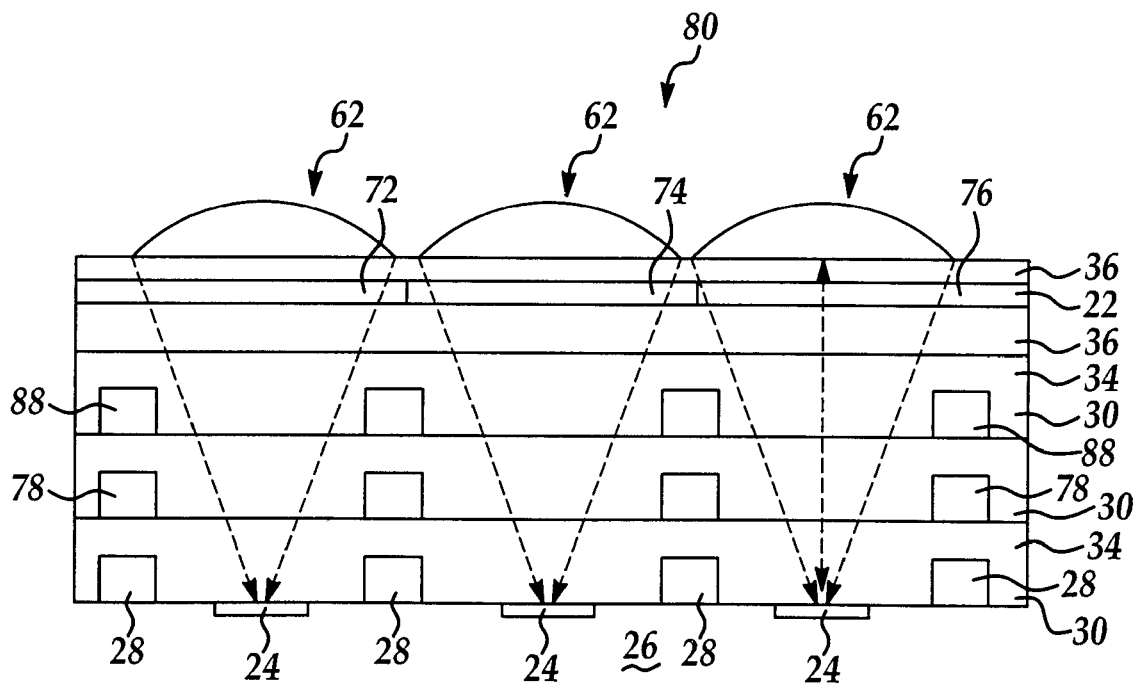
FIG. 5B is an enlarged, cross-sectional view of a present invention CMOS image sensor with a multiplicity of present invention micro-lenses formed thereon.

As shown in FIG. 5B of an enlarged, cross-sectional view of the present invention CMOS image sensor 80, the focal length x that is formed by the present novel invention structure is at least 7 μm, and preferably at least 10 μm to accommodate three separate layers of metal conductors 28, 78 and 88. This structure is frequently seen in a 0.35 μm technology CMOS image sensor application. The long focal length x of the micro-lens 62 therefore allows an accurate focus on the photodiode 24 through the color filter layer 22.

The present invention novel method divides a micro-lens material layer into discrete areas with pre-set spacing therein between for reducing the total volume of the micro-lens material and for allowing a larger diameter micro-lens to be formed. The large diameter micro-lens produces a larger focal length and enables the present invention novel application that includes two or three layers of metal conductors in a CMOS image sensor.

The present invention novel method and device made by the method have therefore been amply described in the above description and in the appended drawings of FIGS. 4A–5B.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for making long focal length micro-lens for color filters comprising the steps of:
   providing a semiconductor substrate having at least one photodiode formed in a top surface;
   forming at least two metal conductor layers with metal conductors embedded in at least two insulating layers;
   forming a photoresist layer on top of said at least two metal conductor layers, said photoresist layer further comprises a color agent therein for forming color filters of at least one of red, green or blue color;
   depositing a layer of micro-lens material on top of said photoresist layer, patterning said layer of micro-lens material into at least four discrete regions for each micro-lens with pre-set spacing therein between; and
   reflowing said at least four discrete regions for each micro-lens and forming said micro-lens.

2. A method for making long focal length micro-lens for color filters according to claim 1 further comprising the step of forming said at least two metal conductor layers to a thickness of at least 7 μm.

3. A method for making long focal length micro-lens for color filters according to claim 1 further comprising the step of forming said at least two metal conductor layers to a thickness of preferably at least 10 μm.

4. A method for making long focal length micro-lens for color filters according to claim 1 further comprising the step of forming said photoresist layer containing a color agent of a pigment or dye therein for forming color filters of red, green and blue.

5. A method for making long focal length micro-lens for color filters according to claim 1 further comprising the step of depositing a layer of micro-lens material of polymeric nature on top of said photoresist layer.

6. A method for making long focal length micro-lens for color filters according to claim 1 further comprising the step of depositing a layer of micro-lens material selected from the group consisting of acrylic and epoxy novolac resin.

7. A method for making long focal length micro-lens for color filters according to claim 1 further comprising the step of depositing a layer of micro-lens material that is transparent on top of said photoresist layer.

8. A method for making long focal length micro-lens for color filters according to claim 1 further comprising the step of patterning said layer of micro-lens material into at least four discrete regions in square shape for each micro-lens.

9. A method for making long focal length micro-lens for color filters according to claim 1 further comprising the step of patterning said layer of micro-lens material into at least four discrete regions in elongated strips for each micro-lens.

10. A method for making long focal length micro-lens for color filters according to claim 1 further comprising the step of patterning said layer of micro-lens material into at least nine discrete regions in square shape for each micro-lens.

11. A method for making long focal length micro-lens for color filters according to claim 1 further comprising the step of forming said pre-set spacing between said at least four discrete regions to larger than 0.01 μm.

12. A method for making long focal length micro-lens for color filters according to claim 1 further comprising the step of providing said semiconductor substrate having at least one photodiode formed in a top surface to a depth of at least 0.1 μm.

\* \* \* \* \*